United States Patent
Ichihashi et al.

(10) Patent No.: US 6,800,219 B2
(45) Date of Patent: Oct. 5, 2004

(54) LIQUID CRYSTAL COMPOSITION, SELECTIVELY REFLECTIVE FILM AND LIQUID CRYSTAL COLOR FILTER

(75) Inventors: Mitsuyoshi Ichihashi, Kanagawa (JP); Masatoshi Yumoto, Shizuoka-ken (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 226 days.

(21) Appl. No.: 10/143,816

(22) Filed: May 14, 2002

(65) Prior Publication Data

US 2003/0098442 A1 May 29, 2003

(30) Foreign Application Priority Data

May 15, 2001 (JP) .......................... 2001-144533

(51) Int. Cl.[7] .................. C09K 19/52; C09K 19/38; G02F 1/1333
(52) U.S. Cl. .................. 252/299.01; 349/106; 349/113; 349/115
(58) Field of Search .................. 252/299.01, 299.3; 349/106, 113, 115; 428/1.3

(56) References Cited

U.S. PATENT DOCUMENTS 6,610,216 B2 * 8/2003 Yumoto et al. ........ 252/299.01
6,645,397 B2 * 11/2003 Ichihashi ............... 252/299.61

\* cited by examiner

*Primary Examiner*—Shean C. Wu
(74) *Attorney, Agent, or Firm*—Sughrue Mion, PLLC

(57) ABSTRACT

The present invention provides a liquid crystal composition comprising a liquid crystal compound having at least one polymerizable group, a photoreactive chiral compound, and a polymerization initiator, wherein a number average molecular weight of the photoreactive chiral compound is from 1,000 to 30,000. The present invention further provides a selectively reflective film including the liquid crystal composition as well as a liquid crystal color filter including the selectively reflective film.

20 Claims, 3 Drawing Sheets

LIQUID CRYSTAL COMPOSITION, SELECTIVELY REFLECTIVE FILM AND LIQUID CRYSTAL COLOR FILTER

BACKGROUND OF THE INVENTION

1. Field of the Invention

The present invention relates to a liquid crystal composition, a selectively reflective film showing selective reflectivity for a range of light from ultraviolet to infrared and a liquid crystal color filter.

2. Description of the Related Art

In recent years, attention has been focused on liquid crystal materials such as a cholesteric liquid crystal with a helical structure, which display a variety of selectively reflected color lights depending on a twisting power (a twist angle) of a helix. Moreover, because these liquid crystal materials have excellent selective reflectivity and color purity of selectively reflected light, these materials have been widely used in applications such as an optical film, a liquid crystal color filter and a recording medium.

A color filter used in a color liquid crystal display or the like, for example, is generally composed of pixels for each of red (R), green (G) and blue (B), and a black matrix is formed in gaps between adjacent pixels for the purpose of increasing display contrast. This kind of color filter has mainly been made of resin in which pigment is dispersed or resin dyed with dye. Fabrication processes therefor are generally: applying colored resin liquid on a glass substrate using a spin coating method or the like to form a colored resist layer and patterning the resist layer through a photolithographic method into color filter pixels; or printing color pixels directly on a substrate.

However, in the fabrication process using printing, for example, a problem arises that the pixel resolution is low, making it difficult to render the process correspond to forming a very fine image pattern. In the fabrication process using the spin coating method, a problem arises that a great loss of material is caused and significant coating nonuniformity occurs in a case of applying on a substrate having a large area. In a fabrication process using electrodeposition, on the other hand, a color filter having a relative high resolution and a more uniform colored layer can be obtained, but this fabrication process is complex and liquid management therein is also difficult.

Considering the above problems and difficulties in the prior art, there has been a need for a fabrication process for a color filter capable of producing a high quality color filter with a high efficiency, simplicity, and convenience, and with less loss of material.

High transmittance and color purity have been required and efforts to meet these requirements for color filter performance have been made in recent years by optimizing the kind of dye and the dyed resin in the processes employing dyes, and by using a more finely dispersed pigment in the processes employing pigments. Extremely high requirements, however, have been imposed on transmittance and color purity of a color filter used in recent liquid crystal display (LCD) panels. Especially in a reflective LCD color filter, on one hand, it is difficult to fulfill requirements for a paper-white white display and contrast, and for color reproducibility. While on the other hand, any color filter obtained by prior art fabricating processes, such as dying resin with a dye or dispersing a pigment, is of a light absorbing type, thus improvement in color purity through further increasing transmittance has almost reached its limit.

To solve these conditions, a polarization color filter made with cholesteric liquid crystal is known. The polarization color filter reflects a predetermined light quantity and transmits the rest to display an image, and is therefore high in utilization efficiency of light, and shows performance superior to that of a light absorbing type color filter in view of transmittance and color purity. On the other hand, a process has been generally adopted for a fabrication process in which a film is formed on a substrate using a spin coating method or the like since a uniform thickness is ensured with the spin coating method. However, these methods have a cost disadvantage from a great loss of materials.

A useful process has been implemented that uses a photoreactive type chiral compound, as means to ensure uniformity of color purity and the like of a color filter film and further to reduce the number of steps of a fabrication process. The process uses a principle that, when a liquid crystal composition including a photoreactive chiral compound is patternwise irradiated with light of wavelengths to which the chiral compound is photosensitive, a reaction of the photoreactive chiral compound progresses according to an intensity of the irradiation energy, thereby altering helical pitches (a twist angle of a helix) of the liquid crystal compound. Thus, selectively reflected colors are produced per pixel by only pattern exposing with different quantities of light. That is, an advantage can be obtained in that patterning in color filter formation is completed with a single mask exposure using a photomask which allows different degrees of illuminance.

Accordingly, after imagewise patterning with light irradiation, the patterned cholesteric liquid crystal compound is fixed, to thereby allow formation of a film functioning as a color filter. This technique can also be applied in an optical film, image recording medium and the like.

However, usually, a number average molecular weight of a photoreactive chiral compound has a value of approximately from 300 to 800, and if a photoreactive chiral compound having one of these molecular weights is adopted, an isomerized photoreactive chiral compound might be moved by molecular diffusion some time after the patterning and before polymerization. Therefore, a problem occurs that, if the photoreactive chiral compound has moved and is then polymerized and fixed, the produced color filter suffers from reduced resolution and forms a foggy image.

SUMMARY OF THE INVENTION

The present invention has been made in view of the prior art problems. Therefore, it is an object of the present invention to provide a selectively reflective film exhibiting high resolution, a liquid crystal color filter including the film and a liquid crystal composition capable of forming the film and the filter.

The present invention has been accomplished on the basis of a finding that a photoreactive chiral compound having a larger molecular weight is inhibited from being moved through molecular diffusion. Specifically, the present invention provides the following:

<1> A liquid crystal composition comprising: a liquid crystal compound having at least one polymerizable group; a photoreactive chiral compound; and a polymerization initiator; wherein a number average molecular weight of the photoreactive chiral compound is from 1,000 to 30,000.

<2> A selectively reflective film comprising a liquid crystal composition, wherein the liquid crystal composition includes a liquid crystal compound having at least one polymerizable group; a photoreactive chiral compound having a number average molecular weight of from 1,000 to 30,000; and a polymerization initiator.

<3> A liquid crystal color filter comprising a selectively reflective film, wherein the selectively reflective film includes a liquid crystal composition containing a liquid crystal compound having at least one polymerizable group; a photoreactive chiral compound having a number average molecular weight of from 1,000 to 30,000; and a polymerization initiator.

DESCRIPTION OF THE PREFERRED EMBODIMENTS

Figure 1A:
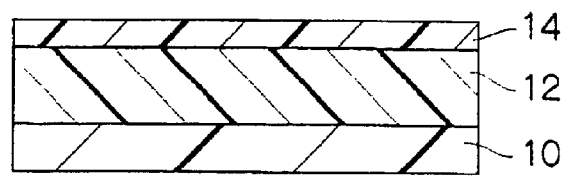
FIGS. 1A to 1I are schematic diagrams showing a fabrication process for a liquid crystal color filter of the present invention.

Description will be given of a liquid crystal composition, a selectively reflective film and a liquid crystal color filter below:

<Liquid Crystal Composition>

A liquid crystal composition of the present invention comprises a liquid crystal compound, preferably a nematic liquid crystal compound, having at least one polymerizable group, a photoreactive chiral compound having a number average molecular weight of from 1,000 to 30,000, and a polymerization initiator, and further comprises, as necessary, a polymerizable monomer, a binder resin, a solvent, a surfactant, a ploymerization inhibitor, a thickener, a colorant, a pigment, a ultraviolet absorbing agent, a gelatinizer and other components.

Detailed descriptions will be given of each of the components below:

(Photoreactive Chiral Compound)

A liquid crystal composition of the present invention comprises a photoreactive chiral compound having a number average molecular weight of from 1,000 to 30,000 and preferably of from 2,500 to 20,000, and when irradiated with light at a desired quantity using a specific pattern, the co-existing liquid crystal compound, preferably a nematic liquid crystal compound, causes a change in a twisting structure to selectively reflect the color of light of a broad wavelength spectrum.

If a selectively reflective film is formed by using the liquid crystal composition including the photoreactive chiral compound having a number average molecular weight of from 1,000 to 30,000, movement of the isomerized photoreactive chiral compound through molecular diffusion is inhibited some time after patterning and before polymerization, to thereby improve resolution.

When a number average molecular weight of a photoreactive chiral compound is less than 1,000, the effect of inhibiting molecular diffusion is not exerted, while the number average molecular weight is in excess of 30,000, not only solubility thereof in a solvent and compatibility with a base liquid crystal are seriously impaired, but also a viscosity of the liquid crystal composition increases to thereby reduce an orientation velocity of a liquid crystal molecule. This tendency becomes more conspicuous with increasing amount of a photoreactive chiral compound added.

The addition amount of a photoreactive chiral compound can be reduced with a larger HTP or a larger degree of change in HTP of the photoreactive chiral compound, and hence, a photoreactive chiral compound having a larger molecular weight may be used. The upper limit of the addition amount of a photoreactive chiral compound is about 30% relative to an entire liquid crystal composition, in view of an aligning time of the compound.

Specific examples of the photoreactive chiral compound include the following compounds, however, these examples are not limiting to the present invention. Any of the following photoreactive chiral compounds (Compounds 1 to 7) are obtained by reacting a component A with a component B at a specified ratio of [A:B] and their number average molecular weights are as shown below. The following photoreactive chiral compounds cause isomerization from trans to cis at the double bond of —CH═C(CN)—.

Compound 1 having a ratio of A:B=4:5 and a number average molecular weight of 2,400, wherein

A:

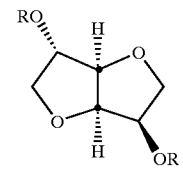

B:

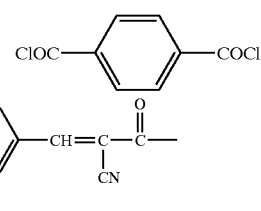

Compound 2 having a ratio of A:B=4:5 and a number average molecular weight of 6,500, wherein

A:

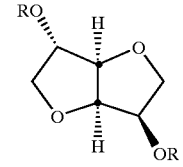

B:

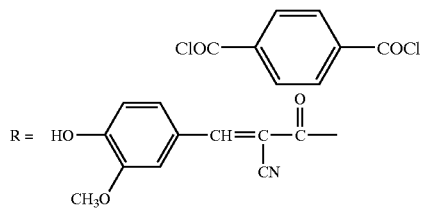

Compound 3 having a ratio of A:B=2:3 and a number average molecular weight of 4,200, wherein

A:

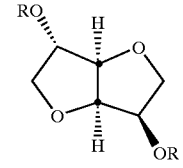

B:

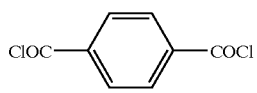

R = 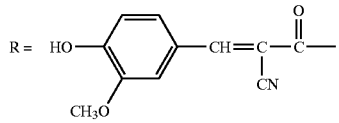

Compound 4 having a ratio of A:B=3:2 and a number average molecular weight of 2,100, wherein

A:

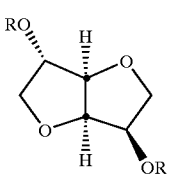

B:

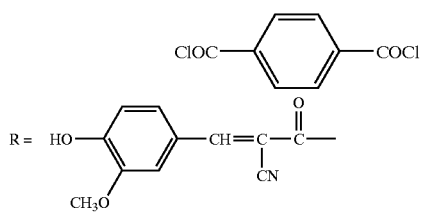

Compound 5 having a ratio of A:B=1:1 and a number average molecular weight of 4,200, wherein

A:

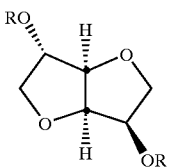

B:

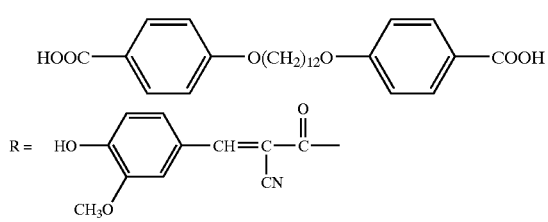

Compound 6 having a ratio of A:B=1:1 and a number average molecular weight of 6,000, wherein

A:

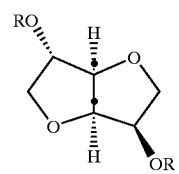

B:

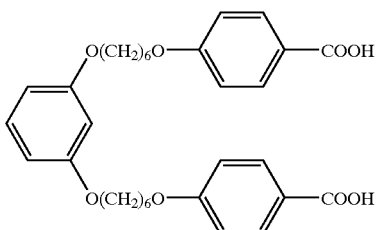

R = 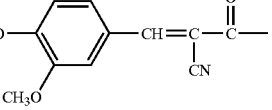

Compound 7 having a ratio of A:B=1:1 and a number average molecular weight of 10,000, wherein

A:

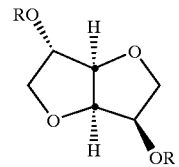

B:

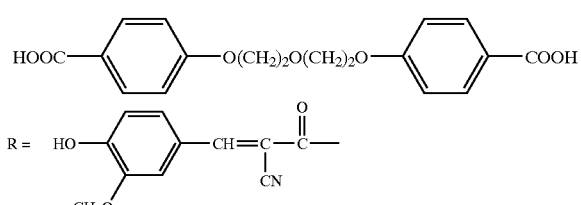

R = 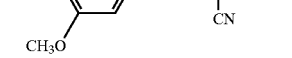

Further, there are exemplified other examples of photoreactive chiral compounds. The following are combinations of the component A (an alcohol component) and the component B (an acid component) to produce photoreactive chiral compounds having a number average molecular weight of from 1,000 to 30,000 by forming an ester linkage between the components A and B, wherein the component A and the component B may be linked either in a regularly alternate pattern or randomly.

[Component A]

First, as a component A, there are shown specific examples 1-1 to 1-12, 2-1 to 2-12, 3-1 to 3-8, 4-1 to 4-8 and 5-1 to 5-8.

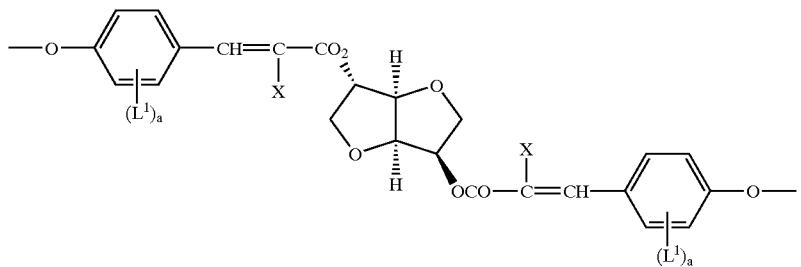
| No. | 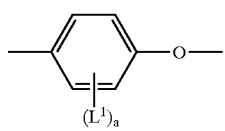 (L¹)ₐ | X |
|---|---|---|
| 1-1 | 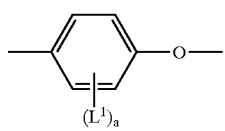 | H |
| 1-2 | 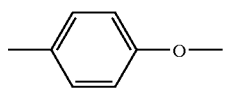 | H |
| 1-3 | 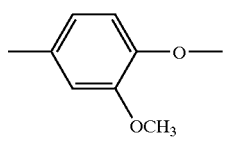 | H |
| 1-4 | 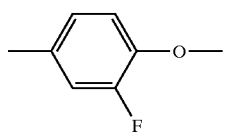 | H |
| 1-5 | 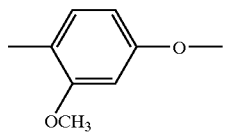 | H |
| 1-6 | 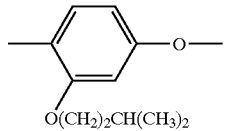 | H |
| 1-7 | 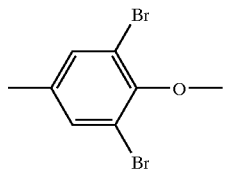 | CN |
| 1-8 | 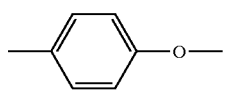 | CN |

-continued
| | | |
|---|---|---|
| 1-9 | 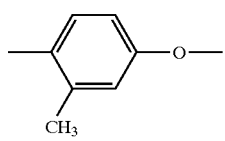 | CN |
| 1-10 | 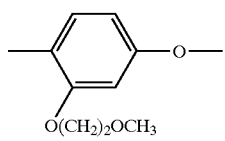 | CN |
| 1-11 | 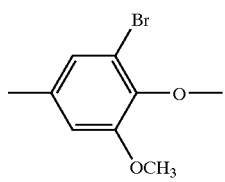 | CN |
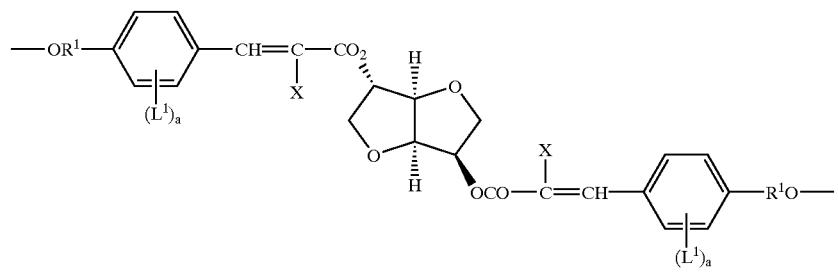
| No. | 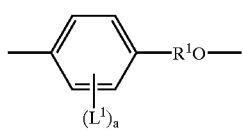 | X |
|---|---|---|
| 2-1 | 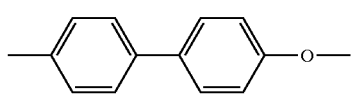 | H |
| 2-2 | 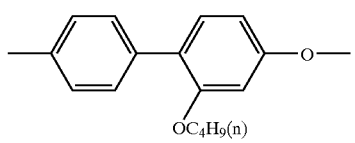 | H |
| 2-3 | 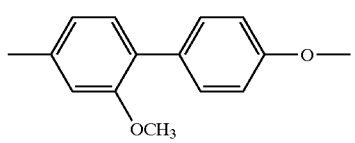 | H |
| 2-4 | 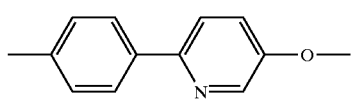 | H |
| 2-5 | 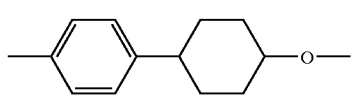 | H |

-continued
| No. | (structure) | X |
|---|---|---|
| 2-6 | 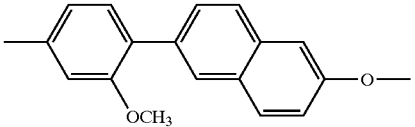 | H |
| 2-7 | 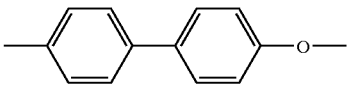 | CN |
| 2-8 | 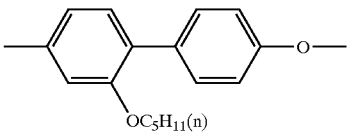 | CN |
| 2-9 | 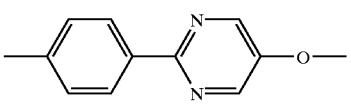 | CN |
| 2-10 | 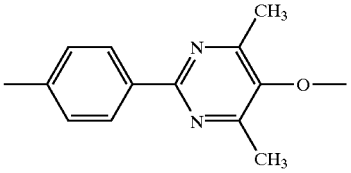 | CN |
| 2-11 | 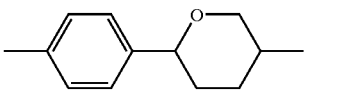 | CN |
| 2-12 | 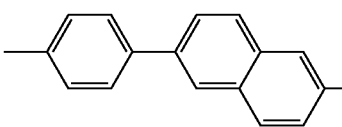 | CN |
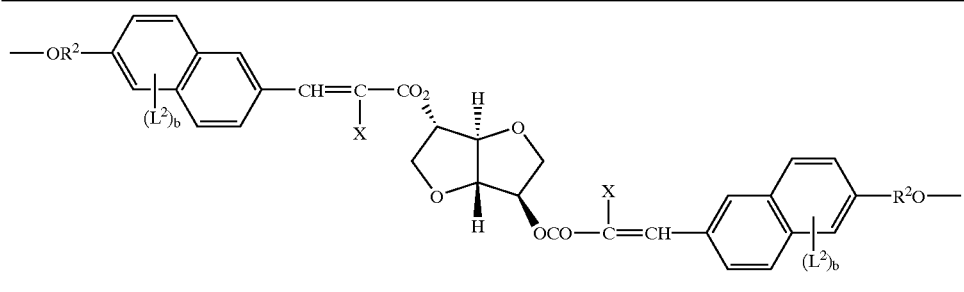
| No. | 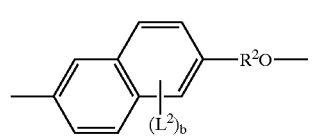 | X |
|---|---|---|
| 3-1 | 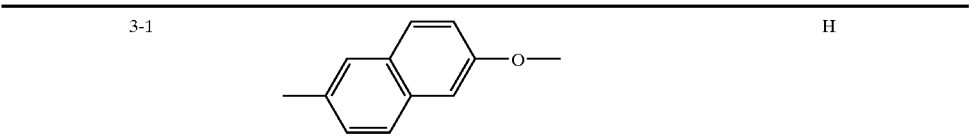 | H |
| 3-2 | 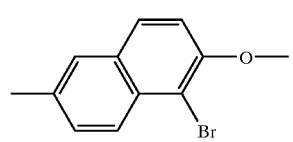 | H |

-continued
| | | |
|---|---|---|
| 3-3 | 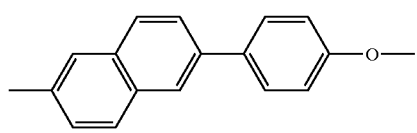 | H |
| 3-4 | 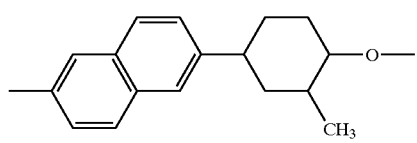 | H |
| 3-5 | 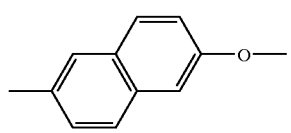 | CN |
| 3-6 | 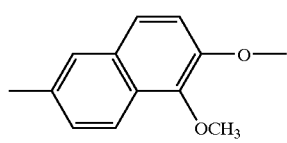 | CN |
| 3-7 | 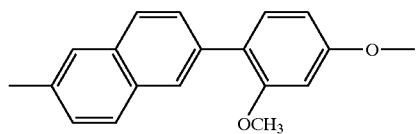 | CN |
| 3-8 | 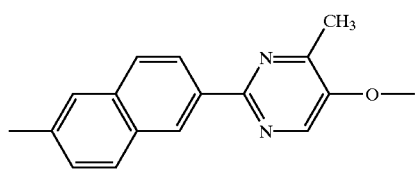 | CN |
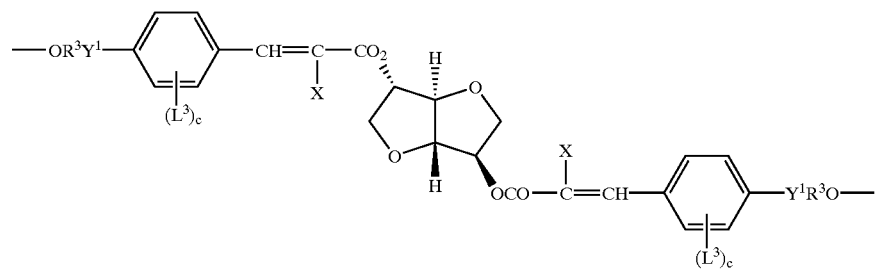
| No. | 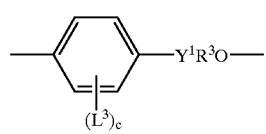 | X |
|---|---|---|
| 4-1 | 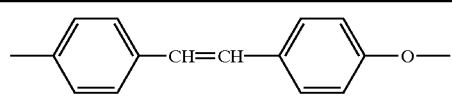 | H |
| 4-2 | 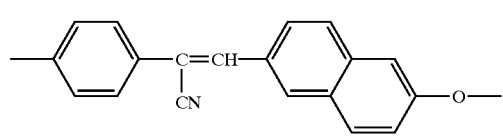 | H |

-continued
| | | |
|---|---|---|
| 4-3 | 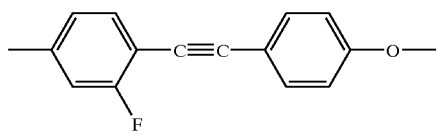 | H |
| 4-4 | 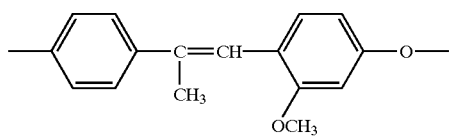 | H |
| 4-5 | 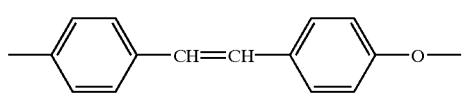 | CN |
| 4-6 | 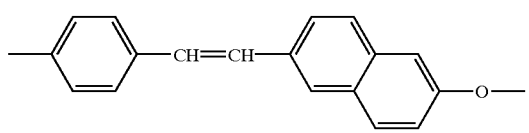 | CN |
| 4-7 | 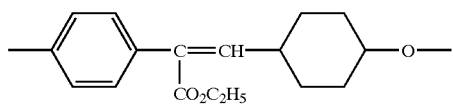 | CN |
| 4-8 | 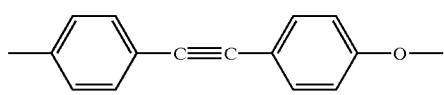 | CN |
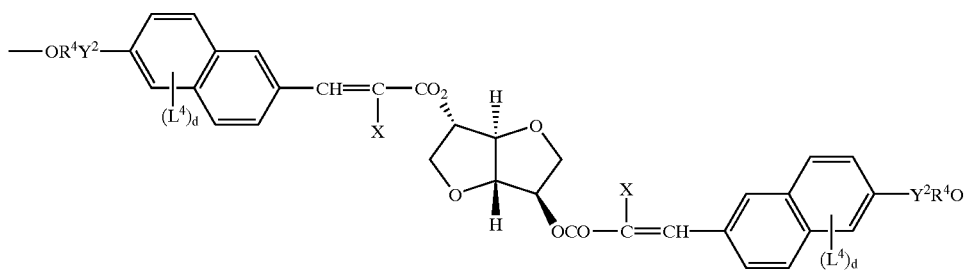
| No. | 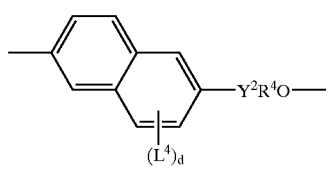 | X |
|---|---|---|
| 5-1 | 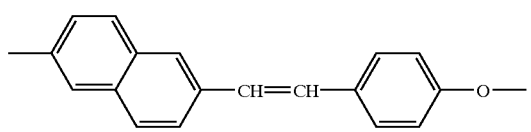 | H |
| 5-2 | 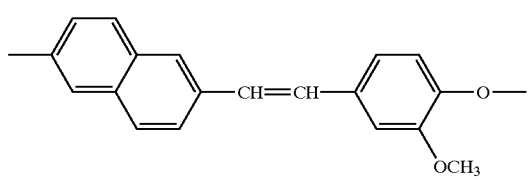 | H |

-continued
| | | |
|---|---|---|
| 5-3 | 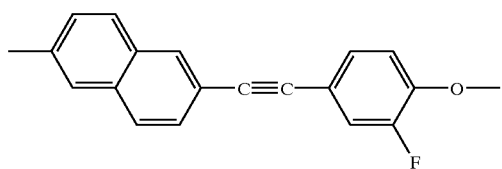 | H |
| 5-4 | 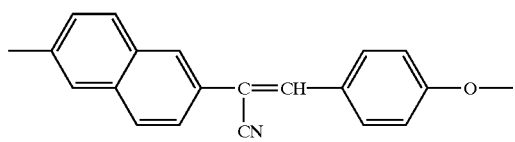 | H |
| 5-5 | 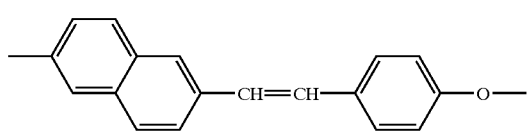 | CN |
| 5-6 | 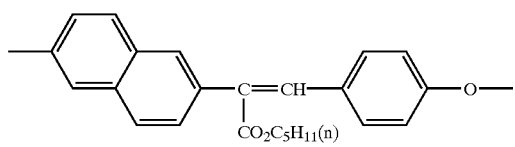 | CN |
| 5-7 | 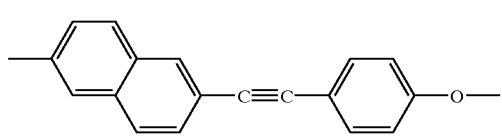 | CN |
| 5-8 | 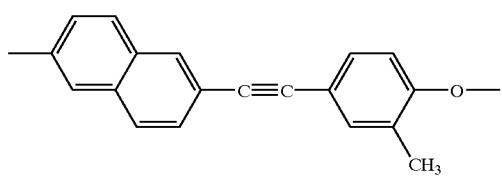 | CN |
In the above examples 1-1 to 1-12, 2-1 to 2-12, 3-1 to 3-8, 4-1 to 4-8 and 5-1 to 5-8, $L^1$ to $L^4$ each represent a halogen atom, an alkyl group or an alkoxy group having a total of 1 to 6 carbon atoms; and a to d each represent an integer of from 0 to 4.
[Component B]
Second, as a component B, there are shown specific examples 6-1 to 6-6.
6-1
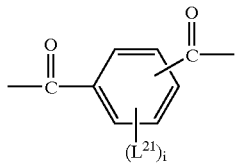
6-2
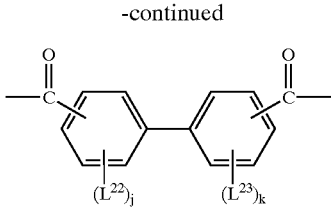
6-3
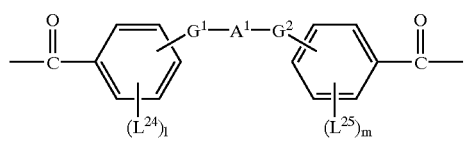
6-4
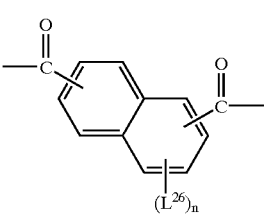

-continued

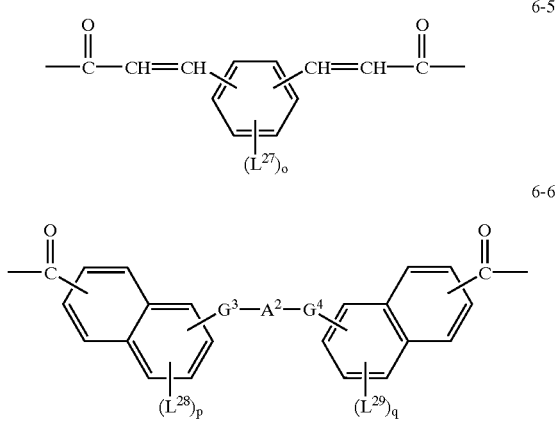

L²¹ to L²⁹ in the above formulae each represent a halogen atom, an alkyl group, an aryl group and alkoxy group, among which preferable are a halogen atom, an alkyl group and an aryl group, and particularly preferable are a halogen atom and an alkyl group. In the above formulae, i to g each represent an integer of 0, 1, 2 and 3, and particularly preferable is 0.

G¹ to G⁴ in the above formulae each represent a single bond, —O—, —S—, —OCO—, —COO—, —OCOO—, —OCO—N(R¹¹)—, —N(R¹²)—COO—, —N(R¹³)—CO—, —CO—N(R¹⁴)— and —N(R¹⁵)—CO—N(R¹⁶)—, among which preferable are a single bond, —O—, —OCO—N(R¹¹)—, —N(R¹²)—COO—, —N(R¹³)—CO— and —N(R¹⁵)—CO—N(R¹⁶)—, and particularly preferable are a single bond, —O— and —N(R¹³)—CO—.

A¹ and A² in the above formulae each represent an alkylene group, an alkenylene group, an alkinylene group and arylene group, among which preferable are an alkylene group, an alkenylene group and arylene group, and particularly preferable are an alkylene group and an arylene group.

The photoreactive chiral compound has properties to control alignment of liquid crystal compounds and alter a helical pitch of a liquid crystal through irradiation with light.

In more detail, a photoreactive chiral compound has a charateristic that if used in combination with a liquid crystal compound, preferably a nematic liquid crystal compound, causes a change in a helical structure of the liquid crystal by irradiation with light of specific wavelengths to which the photoreactive chiral compound is sensitive to induce alteration in a twisting power (HTP: helical twisting power) of a helical structure of the liquid crystal compound. That is, the photoreactive chiral compound has an ability to induce a change in twisting power of a helical structure in a liquid crystal phase by irradiation with light (from ultraviolet, through visible, to infrared) and has a chiral site and a site to undergo a structural change by irradiation with light within a molecule thereof.

A photoreactive chiral compound, especially in a case where a liquid crystal phase is a cholesteric liquid crystal phase, can arbitrarily alter selective reflection of light depending on a HTP of the liquid crystal to thereby achieve selective reflection of light over a broad range of wavelengths including the three primary colors B (blue), G (green) and R (Red). Selective reflection of light of a specific wavelength is determined by a twist angle of a helical structure of liquid crystal molecules, and with a larger variation in the angle, light of a broader range of wavelengths is reflected and thus is useful.

Incidentally, HPT represents a twisting power of a helical structure of a liquid crystal [HTP=1/{a pitch×a chiral agent concentration [a mass fraction]}]. For example, by measuring a helical pitch (an axial length of one period of a helical structure in $\mu$m) of a liquid crystal molecule at a certain temperature, the HTP can be calculated from the concentration of a chiral agent as expressed in $\mu m^{-1}$.

In a case where color is produced by selective reflection of light depending on illumination intensity (illuminance) effected by a photoreactive chiral compound, a ratio of change in HTP (=HTP before irradiation/HTP after irradiation) is preferably at least 1.5 and more preferably at least 2.5 if the HTP decreases after irradiation; while preferably at least 0.7 and more preferably at least 0.4 if the HTP increases after irradiation.

In a case where the photoreactive chiral compound has a structure of a molecule into which one or more polymerizable linking groups have been introduced, heat resistance of a liquid crystal composition including the photoreactive chiral compound, a liquid crystal color filter, an optical film containing the same can be improved.

The photoreactive chiral compound of the present invention can be used together with conventionally known chiral agents exerting no photoreactivity, such as a chiral compound whose twisting power has high temperature dependency. As such chiral agents exerting no photoreactivity, there can be exemplified those described in Japanese Patent Application Laid-Open (JP-A) No. 2000-44451, Japanese Patent Application National Publication No. 10-509726, WO 98/00428, Japanese Patent Application National Publication Nos. 2000-506873 and 9-506088, "Liquid Crystals" 1996, 21, 327 and "Liquid crystals" 1998, 24, 219.

(Liquid Crystal Compound)

The liquid crystal compound can suitably be selected from the group consisting of low-molecular liquid crystal compounds, high-molecular liquid crystal compounds and polymerizable liquid crystal compounds exhibiting an anisotropy in refractive index Δn of from 0.10 to 0.40. Among them, a nematic liquid crystal compound is preferable. While in a molten liquid crystal state, these liquid crystal compounds can be oriented, for example, by using a substrate which has undergone an alignment treatment such as rubbing or the like. In a case where a state of the liquid crystal is fixed as a solid phase, means such as cooling and polymerization can be employed.

As the liquid crystal compounds, the following compounds can be exemplified, without imposing any limitation to the present invention.

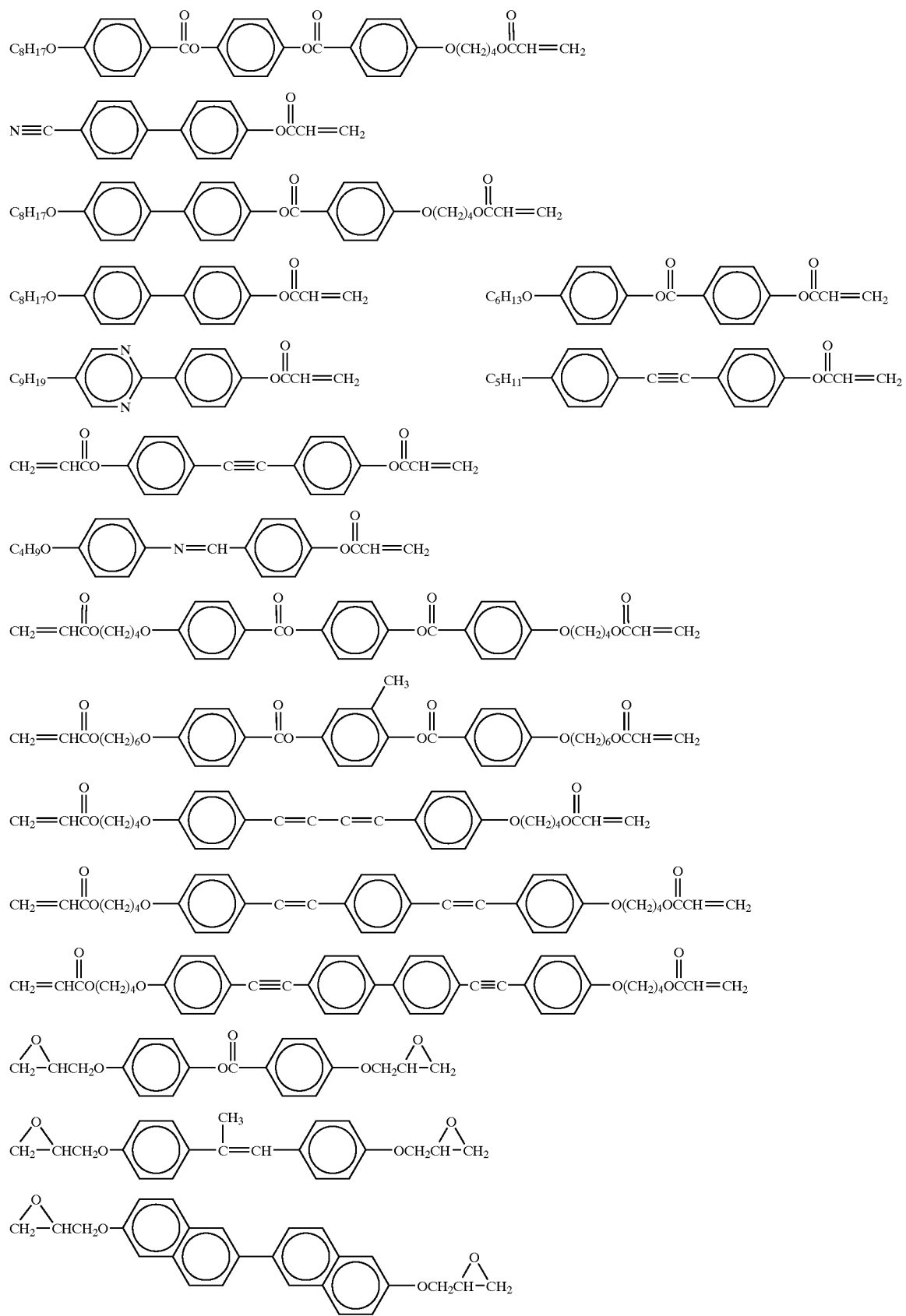

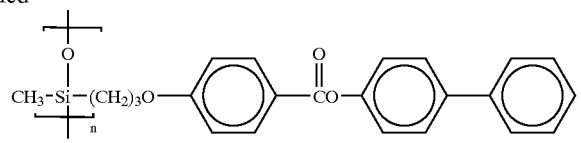

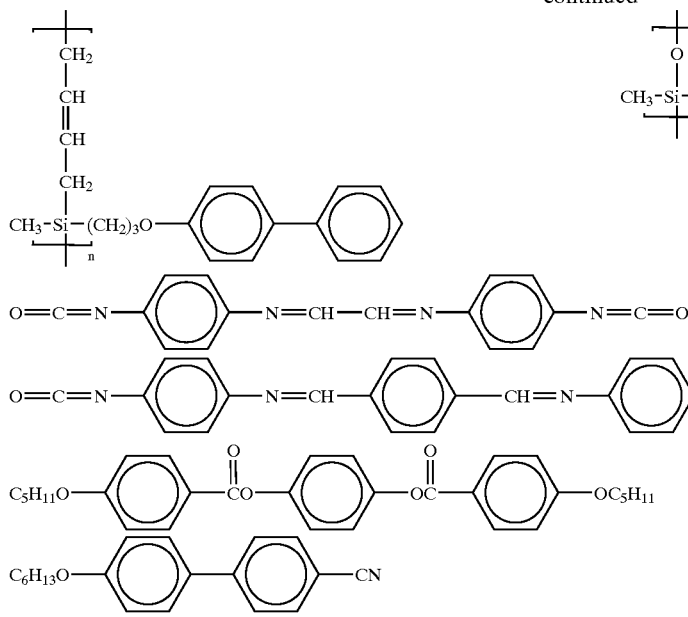

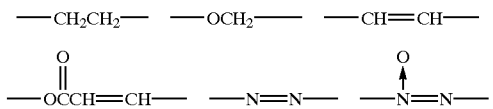

In the above formula, n represents an integer of from 1 to 1,000.

Also usable as preferred examples are compounds similar to the compounds exemplified above, in which a linking group of an aromatic ring is replaced with any group having of the following structures.

—CH$_2$CH$_2$—   —OCH$_2$—   —CH=CH—

—OCCH=CH—   —N=N—   —N=N—
     ‖                              ↑
     O                              O

Among the above liquid crystal compounds, preferable is a liquid crystal compound having at least one polymerizable group or cross-linking group in a molecule from the viewpoints of securing sufficient curability and achieving heat resistance of the layer.

The addition amount of a liquid crystal compound is preferably from 30 to 99.9 mass % and more preferably from 50 to 95 mass % relative to a total solid content of a liquid crystal composition. When the amount is less than 30 mass %, alignment becomes insufficient, failing to obtain a desired selective reflection of color light.

(Photopolymerization Initiator)

In a case where a liquid crystal compound carrying a polymerizable group is used to undergo a polymerization reaction in order to fix a helical structure of a liquid crystal after twisting power has been altered by irradiation with light, it is preferable to add a photopolymerization initiator. Furthermore, it is preferable to swiftly progress a polymerization reaction to cure the liquid crystal composition such that a desired helical structure after its formation can be fixed.

Photopolymerization initiators can suitably be selected from conventionally known compounds, such as, for example, p-methoxyphenyl-2,4-bis(trichloromethyl)-s-triazine, 2-(p-butoxystyryl)-5-trichloromethyl-1,3,4-oxadiazole, 9-phenylacridine, 9,10-dimethylbenzphenazine, benzophenone/Michler's ketone, hexaarylbiimidazole/mercaptobenzimidazole, benzyldimethyl ketal, thioxanthone/amine, triarylsulfonium hexafluorophosphate, bisacylphosphine oxides described in JP-A No. 10-29997 such as bis(2,4,6-trimethylbenzoyl)-phenylphosphine oxides, acylphosphine oxides described in DE No. 4230555 such as Lucirin TPO.

As the photopolymerization initiator described above, it is preferable to choose a photopolymerization initiator having a photosensitive wavelength region different from a photosensitive wavelength region of the photoreactive chiral compound to be described later. As used herein, having different photosensitive wavelength means that central photosensitive wavelengths of both compounds are not overlapped with each other and, for example, a change in alignment in a liquid crystal is suppressed when conducting exposure or curing polymerization by another light irradiation in such an extent that no deterioration occurs in image display characteristics and hue purity of selectively reflected color light. In order not to overlap the photosensitive central wavelengths with each other, wavelengths of irradiated light can also be controlled by passing through a band-pass filter or the like means in addition to utilizing a difference in the molecular structure between the both compounds.

The addition amount of a photopolymerization initiator is preferably from 0.1 to 20 mass % and more preferably from 0.5 to 5 mass % relative to a total solid content of a liquid crystal composition. When the addition amount is less than 0.1 mass %, light irradiation time may be prolonged because of a low curing efficiency of light irradiation, while when the addition amount is in excess of 20 mass %, transmittance of light is occasionally lowered in the ultraviolet to visible wavelength regions.

(Polymerizable Monomer)

A liquid crystal composition of the present invention may further comprise a polymerizable monomer. When a polymerizable monomer is used in combination with the above components, improvement can be achieved in strength of a liquid crystal composition after having fixed a helical structure (selective reflectivity) subsequent to formation of a distribution of selective reflection wavelengths (patterning) by altering a twisting power of a liquid crystal by light irradiation. In a case where a nematic liquid crystal compound has an unsaturated bond in the same molecule, the addition of a polymerizable monomer is not necessarily required.

Examples of the polymerizable monomer include monomers having an ethylenically unsaturated bond. More specifically, there are exemplified polyfunctional monomers such as pentaerythritol tetraacrylate, dipentaerythritol hexaacrylate and the like.

Specific examples of the monomer having an ethylenically unsaturated bond include the compounds shown below. However, these examples are not limiting to the present invention.

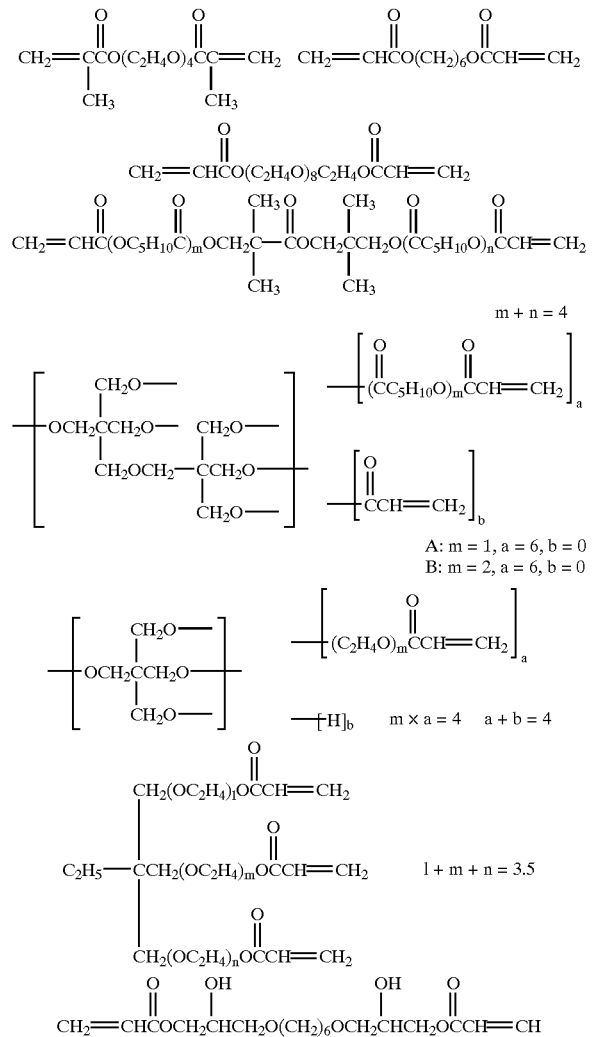

The addition amount of a polymerizable monomer is preferably in a range of from 0.5 to 50 mass % relative to a total solid content of a liquid crystal composition. When the addition amount is less than 0.5 mass %, sufficient curability cannot always be attained, while when the addition amount is in excess of 50 mass %, alignment of liquid crystal molecules are inhibited, thereby failing to produce sufficient color.

(Additional Components)

As additional components, there may be added a binder resin, a solvent, a surfactant, a polymerization inhibitor, a thickener, a colorant, a pigment, an ultraviolet absorbing agent, a gelatinizer and the like.

Examples of the binder resin include polystyrene compounds such as polystyrene, poly-α-methylstyrene and the like; cellulosic resins such as methyl cellulose, ethyl cellulose, acetyl cellulose and the like; acidic cellulose derivatives having a carboxyl group in a side chain; acetal resins such as polyvinyl formal, polyvinyl butyral and the like; methacrylic acid copolymers, acrylic acid copolymers, itaconic acid copolymers, crotonic acid copolymers, maleic acid copolymers, partially esterified maleic acid copolymers and the like described in JP-A No. 59-44615, Japanese Patent Application Publication (JP-B) Nos. 54-34327, 58-12577, 54-25957, JP-A Nos. 59-53836 and 59-71048.

Other examples of binders include homopolymers of acrylic acid alkyl esters and homopolymers of methacrylic acide alkyl esters, including those in which alkyl groups may be a methyl group, an ethyl group, an n-propyl group, an n-butyl group, an iso-butyl group, an n-hexyl group, a cyclohexyl group, a 2-ethylhexyl group and the like.

In addition to the above compounds, there can also be mentioned, as the binder, a polymer having a hydroxyl group to which is added an acid anhydride, benzyl(meth)acrylate/(a methacrylic acid homopolymer) acrylic acid copolymer, multiple copolymers of benzyl(meth)acrylate/(meta)acrylic acid/another monomer and the like.

The amount of the binder resin to be added to a liquid crystal composition is preferably from 0 to 50 mass % and more preferably from 0 to 30 mass %. When the amount is in excess of 50 mass %, alignment occasionally becomes insufficient.

It is preferable that in a liquid crystal composition of the present invention, a surfactant is used simultaneously with a photoreactive chiral agent and a liquid crystal compound, preferably a nematic liquid crystal compound. As the surfactant, a surfactant exerting an excluded volume effect is preferably used. As used herein, exerting an excluded volume effect means that three-dimensional control of a spatial alignment state of a layer formed by a coating including a liquid crystal composition at the interface between the layer and an atmospheric air (at the surface of the layer). In more detail, a nonionic surfactant is preferably used by appropriately choosing from conventionally known nonionic surfactants.

The polymerization inhibitors can be added for the purpose of improving storability. Examples of polymerization inhibitors include hydroquinone, hydroquinone monomethyl ether, phenothiazine, benzoquinone and the derivatives thereof. The addition amount of a polymerization inhibitor is preferably from 0 to 10 mass % and more preferably from 0 to 5 mass % relative to a mass of the polymerizable monomer.

The liquid crystal composition of the present invention can be prepared by dissolving and dispersing the components described above in a suitable solvent, followed by formation into an arbitrary shape or application onto a support or the like for use. Suitable examples of the solvent include 2-butanone, cyclohexanone, methylene chloride and chloroform.

The liquid crystal composition of the present invention preferably includes a surfactant exerting the excluded volume effect distributed at the air interface side. For example, in a case where a layer is formed by applying a liquid crystal composition in a state of a coating liquid, the surfactant serves to three-dimensionally control an alignment state at the surface of the layer interfacing with air, and especially in a case of a cholesteric liquid crystal phase, light having a selectively reflected wavelength and higher color purity can be obtained. Detailed description will be given of the surfactant later.

<Process for Altering Helical Structure of Liquid Crystal>

As described above, the liquid crystal composition of the present invention comprises a photoreactive chiral compound. And the liquid crystal composition of the present invention is patternwise exposed to light while varying quantities of light to alter a twisting power of the liquid crystal, thereby forming regions different from each other in twisting structure, namely, the regions different in twisting degree of the helix (a twisting power: HTP).

Especially, in a case where a liquid crystal phase is a cholesteric liquid crystal phase, selective reflection of color light exhibited by the liquid crystal can arbitrarily be altered by utilizing a twisting power. When the degree of change in a twisting power (a twisting change degree) is large, a broader range of colors selectively reflected by the liquid crystal can be obtained, thereby achieving selective reflection of color lights of a broader wavelengths region including three primary colors (B, G and R).

More specifically, the procedures are conducted as follows:

When a liquid crystal composition is irradiated with light of certain wavelengths, a photoreactive chiral compound present in the composition reacts to light to induce a change in a helical structure (a twisting angle) of the liquid crystal depending on an illumination intensity of applied light, thereby exhibiting selective reflection of color light due to such a structural change and producing an imagewise pattern (patterning). Accordingly, irradiating with light having different illumination intensities at desired regions allows plural colors produced corresponding to the intensities of the applied light. For example, by exposing the liquid crystal composition to light through a photomask prepared imagewise with varying light transmittances, an image exhibiting a distinctively selective color can be produced by a single light irradiation. Methods for irradiating light are not specifically limited insofar as the light intensities can arbitrarily be altered at respective desired regions, instead of using a photomask.

In order to form a liquid crystal color filter, an optical film and the like, to be described later, after imagewise exposure to light of certain wavelengths for patterning, the liquid crystal composition is further irradiated with light such that the polymerizable group in the liquid crystal composition undergoes photopolymerization for curing, to thereby fix an induced helical structure of the liquid crystal to selectively reflect desired color light. Detailed description will be given of the formation process later.

As the light source used for light irradiation, light sources capable of emitting ultraviolet light are preferably adopted because of abilities to cause a structural change and a swift polymerization reaction of a liquid crystal compound. Examples of the light source include a high pressure mercury lamp, a metal halide lamp and an Hg—Xe lamp. Preferably the light source has a function to emit variable quantities of light.

<Process for Fixing Helical Structure of Liquid Crystal>

As described above, by irradiating a photoreactive chiral compound with light of specific wavelengths, a twisting power of a liquid crystal present in the composition is altered to cause a change in a helical structure. The liquid crystal composition of the present invention comprises substantially a liquid crystal compound having polymerizable groups, a photopolymerization initiator and a photoreactive chiral compound. By causing polymerization or cross-linking of the liquid crystal compound, not only the altered helical structure can be fixed, but also strength of the liquid crystal composition after fixing can be enhanced. At this point, a liquid crystal composition of the present invention comprises a photoreactive chiral compound having a relatively larger number average molecular weight as described above, whereby molecular diffusion can be inhibited some time after patterning and before fixing (polymerization for curing).

It is preferable to use a combination of a photopolymerization initiator and a photoreactive chiral compound, each having different sensitive wavelength regions.

More specifically, the fixing process can be performed as described below:

First, in a similar manner to the patterning described in the section of "Process for Altering a Helical Structure of Liquid Crystal", the liquid crystal composition is imagewise exposed to light having a photosensitive wavelength region of the photoreactive compound present in the liquid crystal composition. By this light exposure, the photoreactive compound reacts to cause alteration in a helical structure of the liquid crystal to thus form an imagewise pattern (patterning). After this patterning, the liquid crystal composition is irradiated with light having a photosensitive wavelength region of a photopolymerization initiator present in the liquid crystal composition, to effect polymerization of the liquid crystal compound to thereby fix a state where an altered helical structure is retained. An additional step, such as nitrogen gas replacement, may be included prior to the steps of patterning and fixing.

In a case where the photoreactive compound and the photopolymerization initiator have different sensitive wavelength regions, light irradiation for altering HTP and light irradiation for photopolymerization do not affect each other. Therefore, in a case where imagewise exposure is performed for altering HTP, no photopolymerization reaction does not progress, to thereby allow patterning to produce a predetermined degree of change in HTP. While in a case where photopolymerization for fixing a helical structure is performed, the photoreactive compound does not react to light, whereby the formed pattern having a change in HTP can securely be fixed.

In order to form a liquid crystal color filter, an optical film and the like, to be described later, exposure is performed imagewise using light having wavelengths to which a photoreactive compound is sensitive to conduct patterning, followed by additional light having wavelengths to which a photopolymerization initiator is sensitive such that the polymerizable group in the liquid crystal composition undergoes photopolymerization and curing, thus fixing a helical structure of a liquid crystal to selectively reflect desired color light. Detailed description will be given of formation processes later.

Light sources used for light irradiation are similar to those exemplified in the section of "Process for Altering Helical Structure of Liquid Crystal".

The process for fixing a helical structure of the liquid crystal is carried out by polymerization, or alternatively fixing may be conducted by cross-linking, for example, through vulcanization.

<Selectively Reflective Film>

The selectively reflective film of the present invention comprises the liquid crystal composition described above, in which a liquid crystal compound present in the liquid crystal composition exhibits a helical structure. The structure is fixed by polymerization or cross-linking by aligning a helical axis of the helical structure to be substantially parallel to a normal line of a substrate on which the selectively reflective film is formed, to thereby selectively reflect light of wavelengths in a range of from ultraviolet to infrared.

The selective reflective film of the present invention, including a liquid crystal composition of the present invention described above, is produced while securing suppressed molecular diffusion some time after patterning and before polymerization, to thus allow fixing of a photoreactive chiral compound at a desired position to achieve high resolution.

<Liquid Crystal Color Filter>

The liquid crystal color filter of the present invention comprises a selectively reflective film of the present invention described above. The liquid crystal color filter can be fabricated by irradiating a liquid crystal composition with light in a desired quantity using a given pattern, suitably selected on the basis set forth in the sections of "Process for Altering Helical Structure of Liquid Crystal" and "Process for Fixing Helical Structure of Liquid crystal".

Detailed description will be given of a liquid crystal color filter below, describing a fabrication process therefor.

The fabrication process for a liquid crystal color filter includes, for example, at least one step of patterning through imagewise exposure to a first light followed by exposure to a second light (hereinafter occasionally referred to an "exposing step"). The fabrication process may further include the following steps, depending on the selected embodiment, such as a step of aligning treatment on a surface contacting with a liquid crystal composition (aligning step), a step of transferring and forming a liquid crystal layer by adhering and peeling (transferring step), and a step of applying a nematic liquid crystal composition to form a liquid crystal layer (applying step).

As an example of a fabrication process including the exposing step, a representative embodiment is shown below.

Exposing Step

In an exposing step, patterning and fixing of a liquid crystal compound (polymerization for curing) are performed by irradiation with light. That is, patterning is conducted through imagewise exposure by irradiating a first light of wavelengths to which a photoreactive chiral compound is highly sensitivity, and thereafter photopolymerization is conducted to fix a helical structure of the liquid crystal compound by irradiating a second light to which a polymerization initiator is highly sensitive, to thus achieve selective reflection of desired color light.

When a liquid crystal composition is irradiated with a first light, a photoreactive chiral compound present in the composition reacts to the first light depending on an illumination intensity to cause a change in a helical structure of the liquid crystal, thereby forming an imagewise pattern to exhibit selective reflection of color light due to the structural change. Hence, by irradiating desired regions with light at different illumination intensities, plural colors are produced corresponding to illumination intensities and, for example, by irradiating the liquid crystal composition with light through a photomask prepared imagewise with varying light transmittances, an image producing different selective colors can be formed by a single light exposure. In addition to the above process, by irradiating the liquid crystal composition with a second light for hardening (fixing), a liquid crystal color filter can be fabricated.

The wavelength of the first light is preferably set to a photosensitive wavelength region, especially in the vicinity of a peak-photosensitive wavelength, of the photoreactive chiral compound such that sufficient patterning sensitivity can be obtained. The wavelength of the second light is preferably set to a photosensitive wavelength region, especially in the vicinity of a peak-photosensitive wavelength, of the polymerization initiator such that sufficient photopolymerizing sensitivity can be obtained.

Illumination intensities (illuminance) of the first and the second light are not specifically limited, and the illumination intensities can suitably be selected depending on the material used so as to obtain sufficient photosensitivity at the time of patterning and polymerization for curing. As light sources used for irradiating the first and the second light, light sources similar to those for light exposure to a liquid crystal composition may be employed.

In more detail, the following fabrication processes according to the first and the second embodiments may be adopted and a liquid crystal color filter can preferably be fabricated according to each of the two embodiments.

First Embodiment (1) A Step of Providing a Liquid Crystal Composition in the State of a Coating Liquid on a Tentative Support to form a Transfer Material Having at least a Liquid Crystal Layer.

The above-stated liquid crystal composition in the state of a coating liquid can be prepared by dissolving and dispersing respective components in a suitable solvent. Examples of the solvent include 2-butanone, cyclohexanone, methylene chloride and chloroform.

There may be provided a cushioning layer including a thermoplastic resin or the like between the liquid crystal layer and the tentative support in order to secure adhesion while performing transfer in such a case where foreign matters or the like are present on a body to be transferred. It is preferable to conduct an aligning treatment such as rubbing (aligning step) on a surface of the cushioning layer or the like.

(2) A Step of Laminating the Transfer Material onto a Light Transmissible Substrate.

Besides the light transmissible substrate, there may be used an image receiving material comprising a substrate having disposed thereon an image receiving layer. Alternatively, a liquid crystal composition may directly be applied onto a substrate without using the transfer material (applying step). Coating is applied by a suitable method selected from the conventionally known methods using a bar coater, a spin coater or the like. However, a method using a transfer material is preferable because of a small quantity of materials lost and a low cost.

(3) A Step of Peeling the Transfer Material from the Light Transmissible Substrate to form a Cholesteric Liquid Crystal Layer on the Substrate Described Above (Transferring Step).

The liquid crystal layer may have a multi-layer construction by conducting further lamination after the following step (4).

(4) A Step of Imagewise Exposure by Irradiating the Cholesteric Liquid Crystal Layer with Ultraviolet Light at an Illuminance v1 through a Photomask to form a Pixel Pattern Exhibiting Selective Reflection of Color Light Followed by Further Irradiating the Patterned Cholesteric Liquid Crystal Layer with Ultraviolet Light at an Illuminance v2 to Cure the Layer (Exposing Step).

Second Embodiment (1) A Step of Applying a Liquid Crystal Composition onto a Support to form a Liquid Crystal Layer for Producing a Color Filter The liquid crystal layer can be formed by applying a liquid crystal composition prepared in the state of a coating liquid in a similar manner to the process described above by means of conventionally known coating methods using a bar coater a spin coater or the like.

An alignment layer similar to that described above may be provided between the cholesteric liquid crystal layer and the tentative support described above. It is preferable to conduct an aligning treatment such as rubbing (aligning step) on a surface of the alignment layer or the like.

(2) Exposing Step Similar to the Step (4) of the First Embodiment.

The thickness of a liquid crystal layer (a liquid crystal composition in the form of a sheet) functioning as a liquid crystal color filter is preferably from 1.5 to 4 µm.

Further, detailed description will be given below by referring to FIGS. 1A to 1I. FIGS. 1A to 1I are schematic diagrams showing one typical process for fabricating a liquid crystal color filter of the present invention.

First, the components described above are dissolved in a suitable solvent to prepare a cholesteric liquid crystal composition in a coating liquid state. Here, the components and solvent are the same as described above.

Figure 1B:
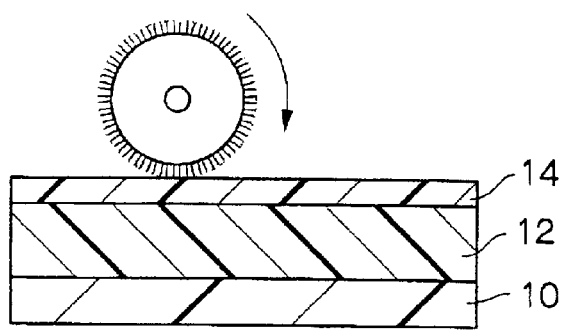

As shown in FIG. 1A, a support 10 (also hereinafter referred to as a "tentative support") is prepared and, for example, acrylic resin, polyester, polyurethane or the like are applied onto the support 10 to form a cushioning layer (a thermoplastic resin layer) 12, followed by laminating an alignment layer 14 made of polyvinyl alcohol and the like. A rubbing treatment is carried out on the alignment layer as shown in FIG. 1B. Although the rubbing treatment is not always necessary, this treatment can improve aligning property.

Figure 1C:
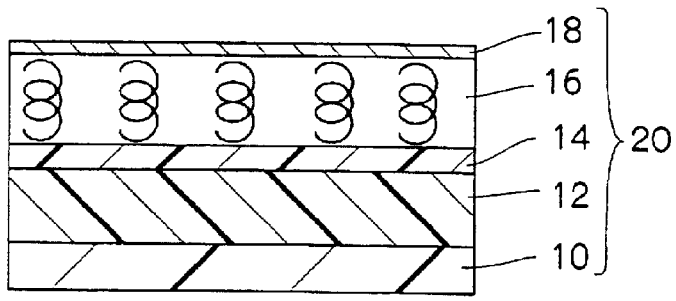

Then, as shown in FIG. 1C, the cholesteric liquid crystal composition in a coating liquid state described above is applied onto the alignment layer 14, followed by drying to form a cholesteric liquid crystal layer 16. Subsequently, a cover film 18 is provided on the thus produced cholesteric liquid crystal layer 16 to thereby form a transfer material. Hereinafter, the transfer material is referred to as a transfer sheet 20.

Figure 1D:
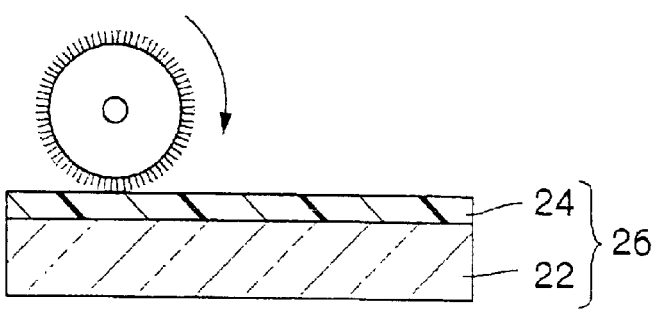

On the other hand, as shown in FIG. 1D, a separate support 22 is prepared and an alignment layer 24 is formed thereon in a similar manner to the above process, followed by rubbing treatment on the surface thereof. Hereinafter, the resultant support 22 is referred to as a color filter substrate 26.

Figure 1E:
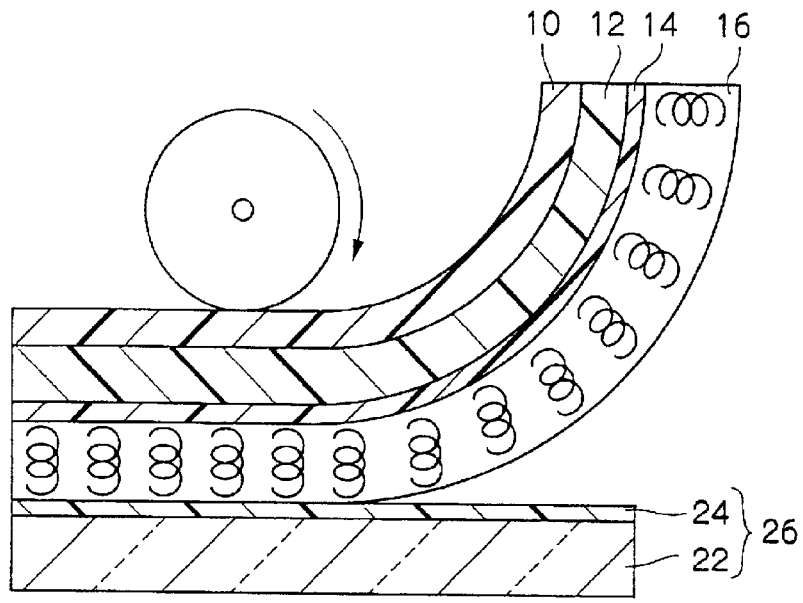
Figure 1F:
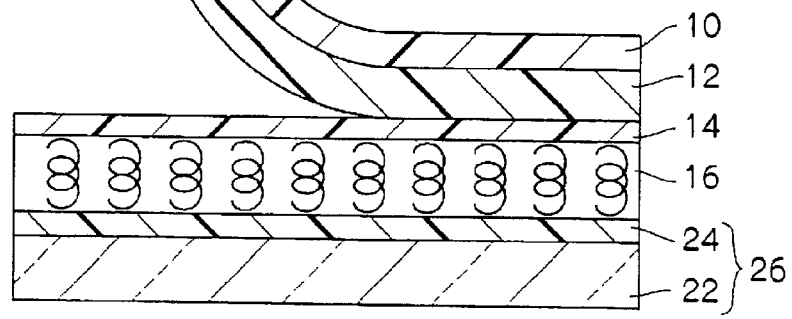

Then, the cover film 18 of the transfer sheet 20 is peeled off, and as shown in FIG. 1E, a surface of the cholesteric liquid crystal 16 of the transfer sheet 20 is brought into contact with a surface of the alignment layer 24 of the color filter substrate 26, followed by lamination by passing through a roll rotating in the direction of arrow mark in the figure. Thereafter, as shown in FIG. 1F, the alignment layer 14 is separated from the cushioning layer 12 of the transfer sheet 20, to allow transferring of the cholesteric liquid crystal layer, together with the alignment layer 14, onto the color filter substrate. In this case, the cushioning layer 12 needs not always be peeled off, together with the tentative support 10, from the alignment layer 14.

Figure 1G:
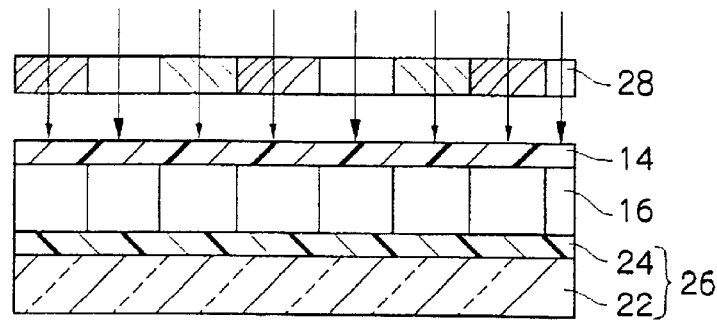

After the transfer, as shown in FIG. 1G, there is provided a photomask 28 having plural regions exhibiting respective different light transmittances above the alignment layer 14 and the cholesteric liquid crystal layer 16 is patternwise exposed to the first light through the mask 28. The cholesteric liquid crystal layer 16 includes a liquid crystal compound, a chiral compound and the like so as to create different helical pitches depending on the illumination intensity of light, whereby structures having different helical pitches from each other are formed in respective patterns. Thus, a region in which green light (G) is reflected while transmitting blue light (B) and red light (R); a region in which blue light (B) is reflected, while transmitting green light (G) and red light (R); and a region in which red light (R) is reflected, while transmitting green light (G) and blue light (B) are formed, respectively.

Figure 1H:
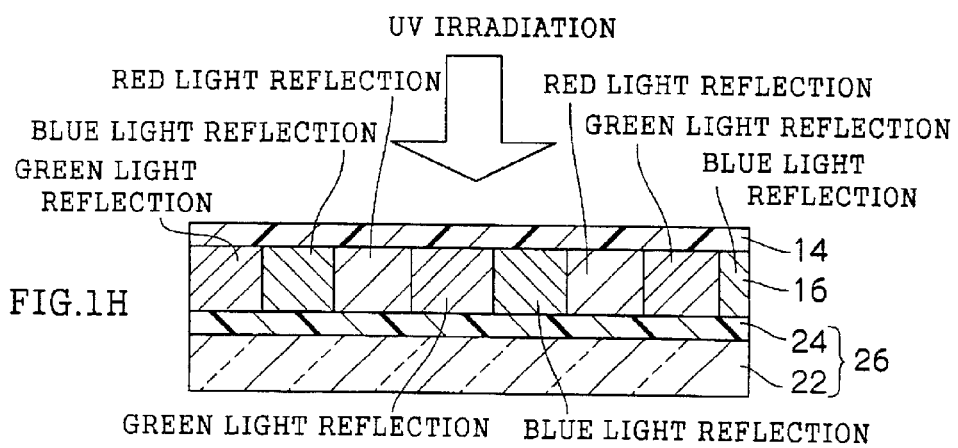

Then, as shown in FIG. 1H, the cholesteric liquid crystal layer 16 is further irradiated with ultraviolet light at an illumination intensity different from that of light irradiated in the above step shown in FIG. 1G to fix the formed pattern. Thereafter, unnecessary portions (for example, residual portions such as the cushioning layer and the intermediate layer, and unexposed portions) on the cholesteric liquid crystal layer 16 are removed using 2-butanone, chloroform or like solvent, to finally form, as shown in FIG. 1I, a cholesteric liquid crystal layer having respective regions to reflect B, G and R light.

Figure 1I:
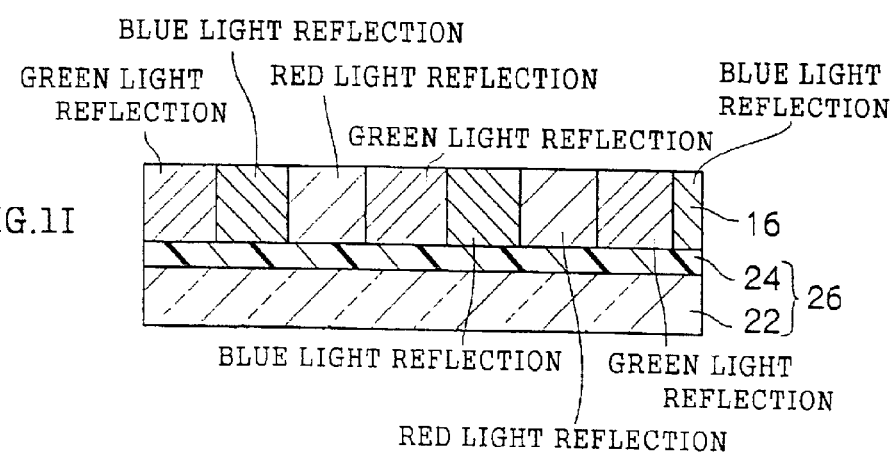

While the schematic diagrams shown in FIGS. 1A to 1I represent one typical process for fabricating a color filter according to a laminating method, another fabrication process according to an applying method may be used in which a liquid crystal layer is provided by applying coating directly on a color filter substrate to form a color filter. In the latter case, compared with the foregoing typical process, after a cholesteric liquid crystal layer has been formed by application of coating onto the alignment layer 24 of the color filter substrate 26 shown in FIG. 1D followed by drying, the steps shown in FIGS. 1G to 1I are successively performed.

The steps used and the materials for a transfer material, a support and the like are detailed in Japanese Patent Application Nos. 11-342896 and 11-343665 previously filed by the present inventors.

In a case where a low-molecular liquid crystal is employed for forming a layer including a liquid crystal composition (a color filter forming layer) by application of coating to fabricate a color filter, an aligning treatment to render liquid crystal molecules orient horizontal at the substrate side produces a state where liquid crystal molecules erect in the direction perpendicular to the surface of the color filter forming layer at the air interface side since one side of a color filter forming layer is at the air interface, whereby an inclination angle (a pretilt angle) of liquid crystal molecules continuously alters toward the thickness direction of the color forming layer. Due to the foregoing, it is usually necessary to dispose the layer between the alignment layers. In a case where a liquid crystal composition undergoes polymerization for use as an optical film, it is necessary to peel off an alignment layer at at least one side after the polymerization to fulfill the requirements of lightweight and low-profile shape, inevitably involving an increase in steps such as disposition of an alignment layer and removal of the same, resulting in an increase in waste materials. Hence, it is preferable to use a surfactant having an excluded volume effect distributed at the air interface side (hereinafter referred to as an "air interface alignment agent").

(Air Interface Alignment Agent)

An air interface alignment agent is a surfactant exerting an excluded volume effect. As used herein, having an excluded volume effect means control of aligning liquid crystal molecules at the air interface side, that is, three-dimensional control of a spatial alignment state of a liquid crystal at a layer surface interfacing with air when a layer including a liquid crystal composition is formed by application of coating. In more detail, this term means control of pretilt angles of liquid crystal molecules at the air interface side.

The requirements for a preferable molecular structure of an air interface alignment agent are to have a flexible hydrophobic moiety and a moiety having at least one ring unit and a structural stiffness (hereinafter referred to as a stiff moiety). The flexible hydrophobic moiety can be either a perfluoro chain or a long alkyl chain depending on the kind of a liquid crystal compound used. Since a hydrophobic moiety is flexible, the hydrophobic moiety can effectively be located on the air side.

An air interface alignment agent may be of a short molecular chain having a molecular weight of the order of several hundreds or of the polymer or the oligomer consisting of the short molecular chain. Furthermore, there may be included a polymerizable functional group in the molecule of the agent depending on the use purposes.

In a case where such an air interface alignment agent is used, a flexible hydrophobic moiety of an air interface alignment agent is arranged to the air interface; and at the same time, a stiff moiety is arranged to a liquid crystal molecule orientation, shaped to be flat and positioned in parallel to the air interface, to thereby permit alignment of liquid crystal molecules parallel to the air interface.

On the other hand, if a stiff moiety is oriented in a direction perpendicular to the air interface, liquid crystal molecules can be aligned in a direction perpendicular to the air interface.

Specifically, a nonionic surfactant is preferably used and the following compounds may be exemplified:

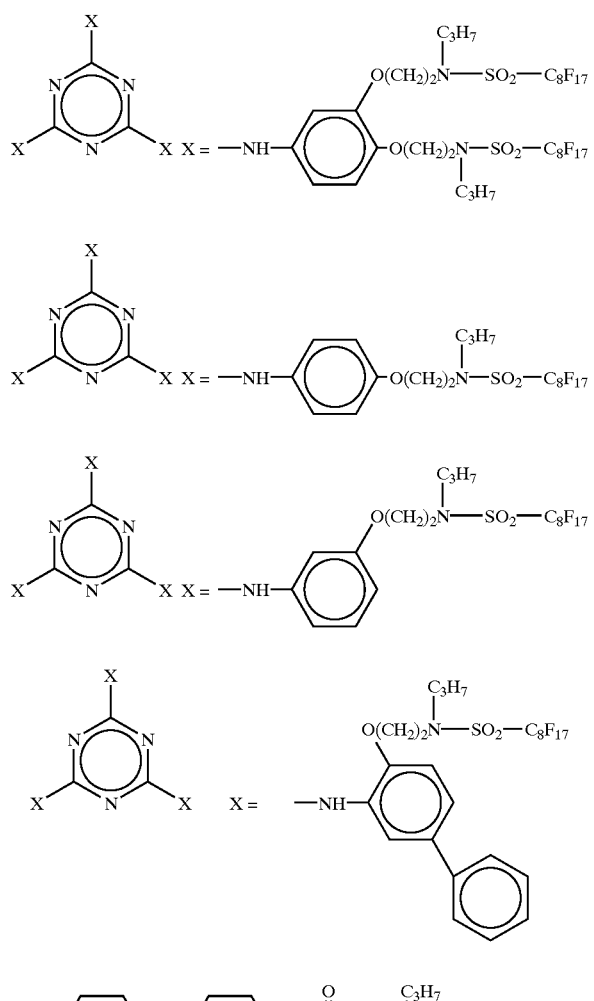

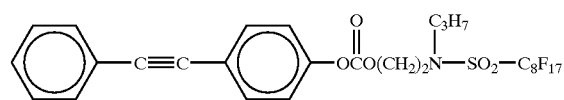

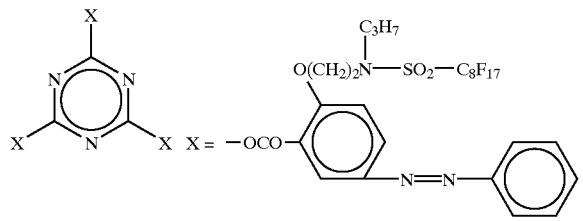

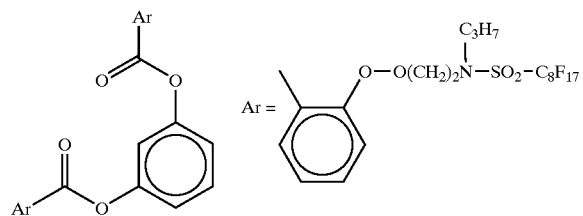

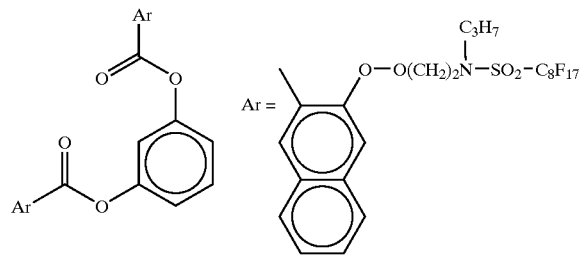

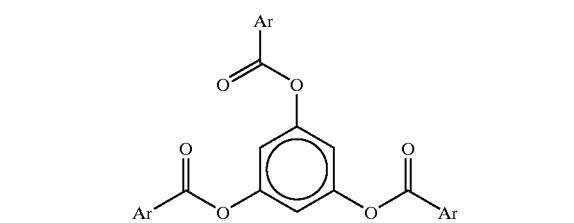

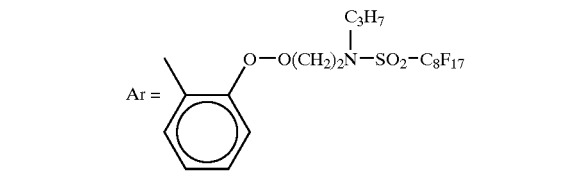

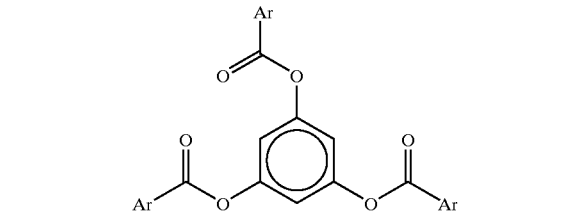

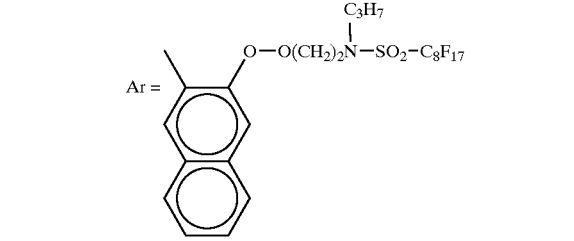

-continued

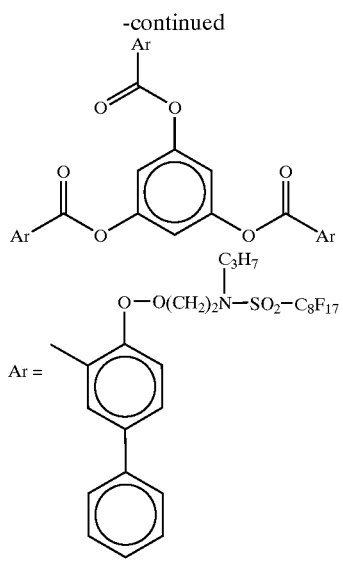

The addition amount of an air interface alignment agent is preferably a quantity to cover a surface of the air interface side of a layer including a liquid crystal composition by one molecule, and preferably of from 0.05 to 5 mass % and more preferably of from 0.1 to 1.0 mass % relative to a total mass of the liquid crystal composition. When the addition amount is less than 0.05 mass %, the effects of the agent are not always exerted, while when the addition amount is in excess of 5 mass %, an air interface alignment agent itself occasionally causes an association, resulting in phase separation from liquid crystal.

If an air interface alignment agent is used, a surface tension can be decreased. Other kinds of surfactants than the air interface alignment agent can be used together with this agent for the purpose of further reducing a surface tension and improving coatability.

EXAMPLES

The present invention will now be illustrated by the following Examples, but it is to be understood that the invention is not limited thereto.

Example 1

1. Preparation of Substrate

A coating liquid for a polyimide alignment layer (LX-1400, produced by Hitachi Chemical DuPont Co., Ltd.) was applied on a glass substrate using a spin coater, followed by drying in an oven at 100° C. for 5 min and subsequent heating in the oven at 250° C. for one hour for baking, to thereby form an alignment layer. Then, an aligning treatment was conducted on the surface of this layer by rubbing to prepare a glass substrate having formed thereon an alignment layer.

2. Formation of Photosensitive Layer

A coating liquid for a photosensitive liquid crystal layer prepared according to the following formulation was applied using a spin coater on the alignment layer disposed on the glass substrate produced as above, followed by drying in the oven at 120° C. for 2 min to form a photosensitive liquid crystal layer. Using a confocal microscope, the thickness of the layer was measured and found to be 2.1 μm.

<Formulation of the Coating Liquid for Photosensitive Liquid Crystal Layer>

| | |
|---|---|
| photoreactive chiral compound<br>Compound 1 (number average molecular weight: 2,400) | 5.8 mass parts |
| base liquid crystal | 91 mass parts |

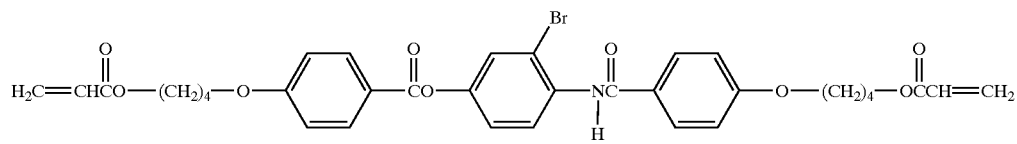

| | |
|---|---|
| air interface alignment agent | 0.2 mass part |

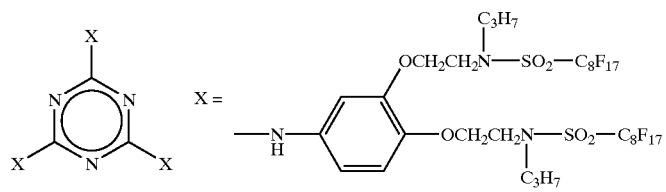

| | |
|---|---|
| polymerization initiator | 3 mass parts |

-continued

<Formulation of the Coating Liquid for Photosensitive Liquid Crystal Layer>

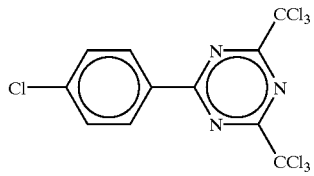

| coating solvent Chloroform | 400 mass parts |
|---|---|

3. Patterning for Color Filter

Then, the glass substrate was maintained on a hot plate at 80° C. for 3 min to align the photosensitive liquid crystal. At this temperature, the liquid crystal layer was formed into a liquid crystal phase to exhibit selective reflection of blue light. Then, the photosensitive liquid crystal layer was irradiated with light using a superhigh pressure mercury lamp at an illumination intensity of 15 mW/cm² for 3 sec through a photomask with apertures of 80 μm in line width and an interference filter having a central wavelength of transmission at 365 nm. The liquid crystal phase irradiated with light at the above temperature exhibited selective reflection of red light.

4. Fixing of Color Filter by Polymerization

The photosensitive liquid crystal layer was maintained at 80° C. for 30 sec until an alignment state formed after irradiation became uniform. Then, light irradiation was conducted using a superhigh pressure mercury lamp at an illumination intensity of 100 mW/cm² for 10 sec through an interference filter having a central wavelength of transmission at 312 nm under nitrogen. The line width of a red portion of the cured selectively reflective film was measured and found to be 83 μm.

Examples 2 to 5

Coating solutions for a photosensitive liquid crystal layer were prepared according to the same formulation as employed in Example 1 except that the photoreactive chiral compound used in Example 1 was replaced with each of the compounds described below, wherein a total addition amount of a photoreactive chiral compound and a base liquid crystal was 96.8 mass parts. Resolution was evaluated in a similar manner to that conducted in Example 1.

| | Photoreactive chiral compound | Number average molecular weight | Addition amount | Resolution |
|---|---|---|---|---|
| Example 2 | Compound 2 | 6,500 | 4.8 mass parts | 81 μm |
| Example 3 | Compound 3 | 4,200 | 4.7 mass parts | 82 μm |
| Example 4 | Compound 4 | 2,100 | 6.2 mass parts | 85 μm |
| Example 5 | Compound 5 | 4,200 | 8.1 mass parts | 82 μm |

Comparative Example 1

A coating liquid for a photosensitive liquid crystal layer was prepared according to the same formulation as employed in Example 1 except that the photoreactive chiral compound used in Example 1 was replaced with 7.5 mass parts of the following photoreactive chiral compound having a number average molecular weight of 600.66, wherein a total addition amount of a photoreactive chiral compound and a base liquid crystal was 96.8 mass parts. Resolution was assessed, in a similar manner to that conducted in Example 1, and found to be 165 μm.

Photoreactive Chiral Compound

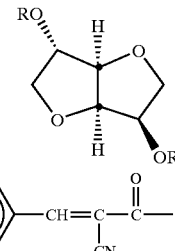

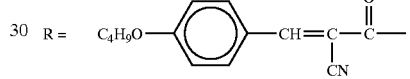

Example 6

The coating liquid for a photosensitive liquid crystal layer prepared in Example 1 was applied and dried, and a glass substrate having disposed thereon this layer was maintained on a hot plate at 80° C. for 3 min to align the photosensitive liquid crystal layer. Then, this photosensitive liquid crystal layer was irradiated with light using a superhigh pressure mercury lamp at an illumination intensity of 15 mW/cm² for 1 sec through a photomask with apertures each in the shape of a stripe of 80 μm in line width at pitches of 270 μm and an interference filter having a central wavelength of transmission at 365 nm. The liquid crystal layer irradiated with light at this temperature exhibited selective reflection of green light. Then, the mask was shifted stepwise by 90 μm in the direction of the line width to repeat irradiation for 3 sec using a similar interference filter and a similar light source to those employed in Example 1. The liquid crystal layer after irradiation with light exhibited selective reflection of red light, while a region irradiated with light in the previous exposure step reflected green light. An unexposed section exhibited selective reflection of blue light.

[Fixing of Color Filter by Polymerization]

The photosensitive liquid crystal layer was maintained at 80° C. for 3 min until an aligned state formed after irradiation became uniform. Then, light irradiation was conducted using a superhigh pressure mercury lamp at an illumination intensity of 100 mW/cm² for 10 sec through an interference filter having a central wavelength of transmission at 312 nm under nitrogen. The line widths of the colored regions of the cured selectively reflective film were measured and found to be all 83 μm, confirming that the liquid crystal layer exhibited good resolution for use as a reflective LCD color filter.

As described above, according to the present invention, there can be provided a high resolution selectively reflective film, a liquid crystal filter including the selectively reflective film and a liquid crystal composition capable of forming the film and the filter.

What is claimed is:

1. A liquid crystal composition comprising: a liquid crystal compound having at least one polymerizable group; a photoreactive chiral compound; and a polymerization initiator; wherein a number average molecular weight of said photoreactive chiral compound is from 1,000 to 30,000, wherein the content of said liquid crystal compound is from 30 to 99.9 mass % of the total solid content.

2. The liquid crystal composition according to claim 1, wherein a number average molecular weight of said photoreactive chiral compound is from 2,500 to 20,000.

3. The liquid crystal composition according to claim 1, further comprising a surfactant having an excluded volume effect distributed at a surface of a layer containing said liquid crystal composition interfacing with air.

4. The liquid crystal composition according to claim 2, further comprising a surfactant having an excluded volume effect distributed at a surface of a layer containing said liquid crystal composition interfacing with air.

5. The liquid crystal composition according to claim 1, wherein said liquid crystal compound is a nematic liquid crystal compound exhibiting an anisotropy in refractive index Δn of from 0.10 to 0.40.

6. The liquid crystal composition according to claim 2, wherein said liquid crystal compound is a nematic liquid crystal compound exhibiting an anisotropy in refractive index Δn of from 0.10 to 0.40.

7. The liquid crystal composition according to claim 1, wherein the content of said polymerization initiator is from 0.1 to 20 mass % of the total solid content.

8. The liquid crystal composition according to claim 2, wherein the content of said polymerization initiator is from 0.1 to 20 mass % of the total solid content.

9. The liquid crystal composition according to claim 3, wherein said surfactant is a nonionic surfactant.

10. A selectively reflective film comprising a liquid crystal composition, wherein said liquid crystal composition includes: a liquid crystal compound having at least one polymerizable group; a photoreactive chiral compound having a number average molecular weight of from 1,000 to 30,000; and a polymerization initiator,
wherein the content of said liquid crystal compound is from 30 to 99.9 mass % of the total solid content.

11. The selectively reflective film according to claim 10, wherein a number average molecular weight of said photoreactive chiral compound is from 2,500 to 20,000.

12. The selectively reflective film according to claim 10, wherein said liquid crystal composition further comprises a surfactant having an excluded volume effect distributed at a surface of a layer containing said liquid crystal composition interfacing with air.

13. The selectively reflective film according to claim 10, wherein said liquid crystal compound exhibits a helical structure, and said structure is fixed by polymerization or cross-linking by aligning a helical axis of said helical structure to be substantially parallel to a normal line of a substrate on which said selectively reflective film is formed to selectively reflect light of wavelengths of from ultraviolet to infrared.

14. The selectively reflective film according to claim 12, wherein said surfactant is a nonionic surfactant.

15. A liquid crystal color filter comprising a selectively reflective film, wherein said selectively reflective film includes:
a liquid crystal composition containing a liquid crystal compound having at least one polymerizable group,
a photoreactive chiral compound having a number average molecular weight of from 1,000 to 30,000, and
a polymerization initiator,
wherein the content of said liquid crystal compound is from 30 to 99.9 mass % of the total solid content.

16. The liquid crystal color filter according to claim 15, wherein a number average molecular weight of said photoreactive chiral compound is from 2,500 to 20,000.

17. The liquid crystal color filter according to claim 15, wherein said liquid crystal composition further comprises a surfactant having an excluded volume effect distributed at a surface of a layer containing said liquid crystal composition interfacing with air.

18. The liquid crystal color filter according to claim 17, wherein said surfactant is a nonionic surfactant.

19. The selectively reflective film according to claim 11, wherein said liquid crystal composition further comprises a surfactant having an excluded volume effect distributed at a surface of a layer containing said liquid crystal composition interfacing with air.

20. The liquid crystal color filter according to claim 16, wherein said liquid crystal composition further comprises a surfactant having an excluded volume effect distributed at a surface of a layer containing said liquid crystal composition interfacing with air.

* * * * *